US012622187B2

(12) United States Patent
Wada et al.

(10) Patent No.: US 12,622,187 B2
(45) Date of Patent: May 5, 2026

(54) SUBSTRATE PROCESSING METHOD AND SUBSTRATE PROCESSING APPARATUS

(71) Applicant: Tokyo Electron Limited, Tokyo (JP)

(72) Inventors: Makoto Wada, Nirasaki (JP);
Nobutake Kabuki, Nirasaki (JP);
Ryota Ifuku, Nirasaki (JP); Takashi Matsumoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 421 days.

(21) Appl. No.: 18/252,408

(22) PCT Filed: Nov. 2, 2021

(86) PCT No.: PCT/JP2021/040317
§ 371 (c)(1),
(2) Date: May 10, 2023

(87) PCT Pub. No.: WO2022/102463
PCT Pub. Date: May 19, 2022

(65) Prior Publication Data
US 2023/0420294 A1     Dec. 28, 2023

(30) Foreign Application Priority Data
Nov. 16, 2020    (JP) ................................. 2020-190166

(51) Int. Cl.
*H01L 21/02*      (2006.01)
*C01B 32/186*      (2017.01)
(Continued)

(52) U.S. Cl.
CPC ...... *H01L 21/02381* (2013.01); *C01B 32/186* (2017.08); *C23C 16/02* (2013.01); *C23C 16/26* (2013.01); *C23C 16/4583* (2013.01); *C23C*

*16/50* (2013.01); *H01J 37/32715* (2013.01); *H01L 21/02068* (2013.01); *H01L 21/0245* (2013.01); *H01L 21/02488* (2013.01); *H01L 21/02502* (2013.01); *H01L 21/02513* (2013.01);
(Continued)

(58) Field of Classification Search
None
See application file for complete search history.

(56) References Cited

U.S. PATENT DOCUMENTS 7,468,326 B2 * 12/2008 Chen ................... H01L 21/0209
257/E21.546
2008/0138995 A1 * 6/2008 Omura .............. H01J 37/32091
257/E21.311
(Continued)

FOREIGN PATENT DOCUMENTS

JP      2004-152862 A     5/2004
JP      2008-112854 A     5/2008
JP      2019-055887 A     4/2019

*Primary Examiner* — Allan W. Olsen
(74) *Attorney, Agent, or Firm* — Armstrong Teasdale LLP

(57) ABSTRACT

A substrate processing method of processing a substrate having a base film includes a loading process of loading the substrate into a processing container, a first process of performing a first plasma process in a state where the loaded substrate is held at a first position by raising substrate support pins of a stage arranged in the processing container, and a second process of performing a second plasma process while holding the substrate at a second position by lowering the substrate support pins.

18 Claims, 11 Drawing Sheets

(51) Int. Cl.

| | |
|---|---|
| *C23C 16/02* | (2006.01) |
| *C23C 16/26* | (2006.01) |
| *C23C 16/458* | (2006.01) |
| *C23C 16/50* | (2006.01) |
| *H01J 37/32* | (2006.01) |
| *H01L 21/768* | (2006.01) |

(52) U.S. Cl.
CPC .... *H01L 21/02527* (2013.01); *H01L 21/0262* (2013.01); *H01L 21/02658* (2013.01); *H01L 21/7685* (2013.01); *H01J 2237/20235* (2013.01); *H01J 2237/334* (2013.01)

(56) References Cited

U.S. PATENT DOCUMENTS

| | | | | |
|---|---|---|---|---|
| 2013/0025790 A1* | 1/2013 | Matsuda | ............. | H01J 37/3244 118/723 R |
| 2025/0140530 A1* | 5/2025 | Hong | ............... | H01J 37/32449 |

* cited by examiner

```
          ┌─────────────┐
          │    Start     │
          └─────────────┘
                 │
                 ▼          ⌐S11
        ┌──────────────────────┐
        │    Loading wafer      │
        └──────────────────────┘
                 │
                 ▼          ⌐S12
        ┌──────────────────────┐
        │    Etching process    │
        └──────────────────────┘
                 │
                 ▼          ⌐S13
        ┌──────────────────────┐
        │  Film forming process │
        └──────────────────────┘
                 │
                 ▼          ⌐S14
        ┌──────────────────────┐
        │   Unloading wafer     │
        └──────────────────────┘
                 │
                 ▼          ⌐S15
        ┌──────────────────────┐
        │   Cleaning process    │
        └──────────────────────┘
                 │
                 ▼
          ┌─────────────┐
          │     End      │
          └─────────────┘
```

FIG. 10

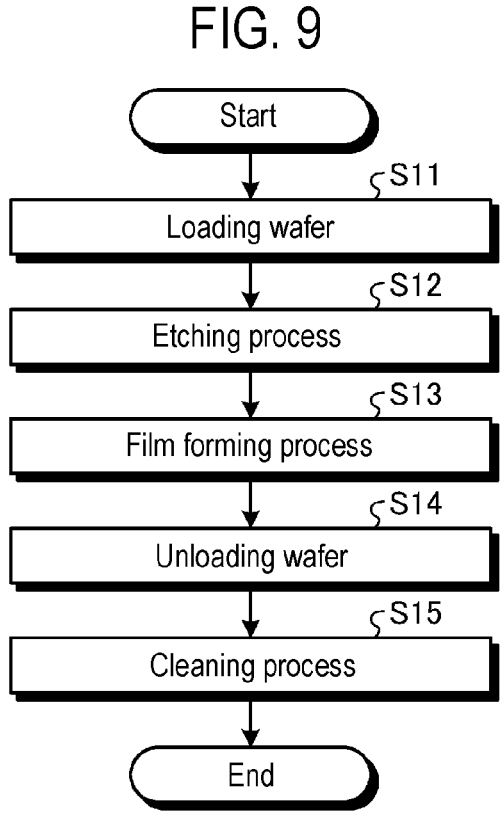

51  52                53                    50                        54

Luminous intensity [%]

40
35
30
25
20
15
10
5
0

0        50        100        150        200        250

Process time [s]

SUBSTRATE PROCESSING METHOD AND SUBSTRATE PROCESSING APPARATUS

CROSS-REFERENCE TO RELATED APPLICATIONS

The present application is a U.S. National Stage Entry of International Patent Application No. PCT/JP2021/040317, filed Nov. 2, 2021, which claims the benefit of priority to Japanese Patent Application No. 2020-190166, filed Nov. 16, 2020, each of which is hereby incorporated herein by reference in its entirety.

TECHNICAL FIELD

The present disclosure relates to a substrate processing method and a substrate processing apparatus.

BACKGROUND

In recent years, a graphene film has been proposed as a new thin-film barrier layer material to replace a metal nitride film. A graphene film formation technology has been proposed to use, for example, a microwave plasma chemical vapor deposition (CVD) apparatus to form a graphene film at a high radical density and a low electron temperature, thereby directly forming a graphene film on a silicon substrate, an insulating film, etc. (for example, Patent Document 1). Further, it has also been known to perform wet cleaning using, for example, a diluted hydrofluoric acid solution in order to remove a natural oxide film adhered to a substrate surface before film formation (for example, Patent Document 2).

PRIOR ART DOCUMENTS

Patent Documents

Patent 1: Japanese Patent Laid-Open Publication No. 2019-055887
Patent 2: Japanese Patent Laid-Open Publication No. 2004-152862
The present disclosure provides a substrate processing method and a substrate processing apparatus capable of forming a high-quality and low-defect film.

SUMMARY

According to one embodiment of the present disclosure, there is provided a substrate processing method of processing a substrate having a base film, the method including a loading process of loading the substrate into a processing container, a first process of performing a first plasma process in a state where the loaded substrate is held at a first position by raising substrate support pins of a stage arranged in the processing container, and a second process of performing a second plasma process while holding the substrate at a second position by lowering the substrate support pins.

According to the present disclosure, it is possible to form a high-quality and low-defect film.

BRIEF DESCRIPTION OF DRAWINGS

FIG. 3 is a diagram illustrating an example of a state of a substrate after formation of a metal film according to the first embodiment.

FIG. 9 is a flowchart illustrating an example of a film forming process according to the first embodiment.

FIG. 10 is a diagram illustrating an example of a state of the substrate after formation of a graphene film according to the first embodiment.

DETAILED DESCRIPTION

Hereinafter, embodiments of a substrate processing method and a substrate processing apparatus disclosed herein will be described in detail with reference to the drawings. In addition, the disclosed technology is not limited by the following embodiments.

Conventionally, a metal nitride film (for example, TiN) has been used as a thin-film barrier layer material. On the other hand, graphene is a two-dimensional crystal structure with a carbon six-membered ring structure, and has a dense and flat atomic structure, high thermal conductivity, and chemical and physical stabilities. For example, in a case where a microwave plasma CVD apparatus is used to form a graphene film on polycrystalline silicon (Poly-Si: hereinafter also referred to as polysilicon), it is necessary to remove a natural oxide film adhered to a surface. It has been known that the natural oxide film is removed by wet cleaning as described above, but the surface of a cleaned substrate is re-oxidized due to exposure to the atmosphere, transfer of the substrate, etc. before graphene film formation, so that oxides on the substrate surface may affect the graphene film formation. Therefore, a high-quality and low-defect film (graphene film) can be formed by removing the oxides caused by the re-oxidation of the substrate surface.

First Embodiment

[Configuration of Substrate Processing Apparatus 100]

Figure 1:
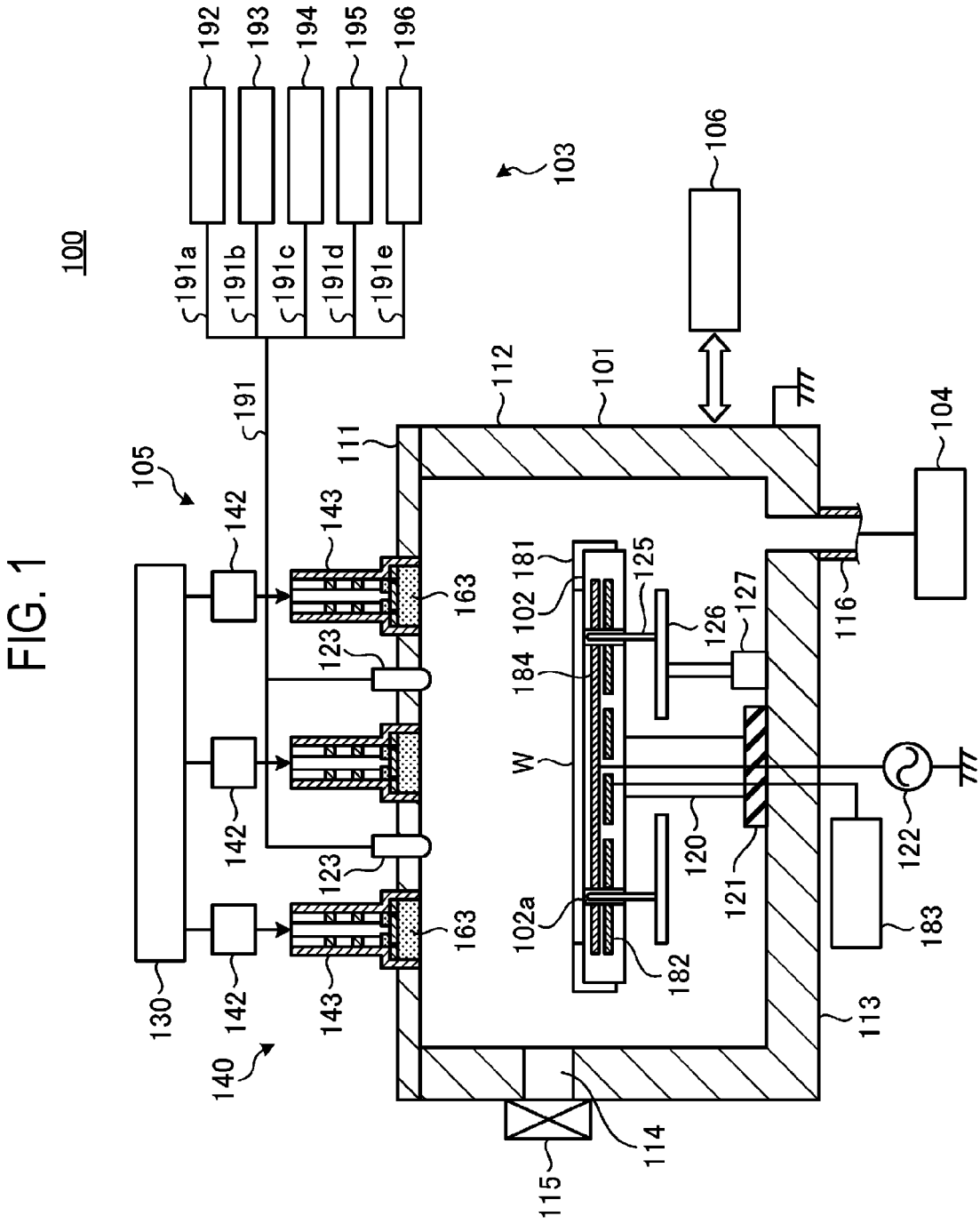
FIG. 1 is a diagram illustrating an example of a substrate processing apparatus according to a first embodiment of the present disclosure.

FIG. 1 is a diagram illustrating an example of a substrate processing apparatus according to a first embodiment of the present disclosure. The substrate processing apparatus 100 illustrated in FIG. 1 includes a processing container 101, a stage 102, a gas supply mechanism 103, an exhaust device 104, a microwave introduction device 105, and a controller 106. The processing container 101 accommodates a wafer W therein. The wafer W is placed on the stage 102. The gas supply mechanism 103 supplies a gas into the processing container 101. The exhaust device 104 exhausts the interior of the processing container 101. The microwave introduction device 105 generates microwaves for generating plasma in the processing container 101 and introduces the microwaves into the processing container 101. The controller 106 controls an operation of each part of the substrate processing apparatus 100.

The processing container 101 is formed of, for example, a metal material such as aluminum and an alloy thereof, has a substantially cylindrical shape, and includes a plate-shaped ceiling wall portion 111, a bottom wall portion 113, and a sidewall portion 112 connecting them. The microwave introduction device 105 is provided on the top of the processing container 101 and functions as a plasma generator that introduces electromagnetic waves (microwaves) into the processing container 101 to generate plasma. The microwave introduction device 105 will be described in detail later.

The ceiling wall portion 111 has a plurality of openings into which a microwave radiation mechanism of the microwave introduction device 105 to be described later and a gas introducer are engaged. The sidewall portion 112 has a loading/unloading port 114 for loading and unloading the wafer W, which is a processing target substrate, into and from transfer chamber (not illustrated) adjacent to the processing container 101. The loading/unloading port 114 is configured to be opened and closed by a gate valve 115. The bottom wall portion 113 is provided with the exhaust device 104. The exhaust device 104 is provided in an exhaust pipe 116 connected to the bottom wall portion 113 and includes a vacuum pump and a pressure control valve. The interior of the processing container 101 is exhausted via the exhaust pipe 116 by the vacuum pump of the exhaust device 104. The internal pressure of the processing container 101 is controlled by the pressure control valve.

The stage 102 has a disk shape and is made of ceramics such as AlN. The stage 102 is supported by a cylindrical support member 120 made of ceramics such as AlN, which extends upward from the bottom center of the processing container 101. A guide ring 181 for guiding the wafer W is provided on the outer edge of the stage 102. Further, substrate support pins 125 for elevating the wafer W are provided inside the stage 102 so as to protrude from and retract to an upper surface of the stage 102. The substrate support pin 125 is arranged on a disk-shaped plate member 126 and is inserted into a through-hole 102a of the stage 102. The substrate support pin 125 may protrude from and retract to the upper surface of the stage 102 as the plate member 126 is vertically moved by an elevating mechanism 127.

Furthermore, a resistive heating type heater 182 is embedded inside the stage 102. The heater 182 heats the wafer W thereabove via the stage 102 upon receiving power from a heater power supply 183. Further, a thermocouple (not illustrated) is inserted into the stage 102. The heating temperature of the wafer W is controllable to a predetermined temperature in the range of, for example, 300 degrees C. to 1000 degrees C. based on a signal from the thermocouple. Furthermore, an electrode 184 having approximately the same size as the wafer W is embedded above the heater 182 in the stage 102. A radio frequency bias power supply 122 is electrically connected to the electrode 184. A radio frequency bias for attracting ions is applied to the stage 102 from the radio frequency bias power supply 122. In addition, the radio frequency bias power supply 122 may not be provided depending on the characteristics of a plasma processing.

The gas supply mechanism 103 is for introducing a plasma generation gas and a raw material gas for forming a graphene film (carbon-containing film) into the processing container 101 and includes a plurality of gas introduction nozzles 123. The gas introduction nozzles 123 are fitted into openings formed in the ceiling wall portion 111 of the processing container 101. A gas supply pipe 191 is connected to the gas introduction nozzles 123. This gas supply pipe 191 is branched into five branch pipes 191a, 191b, 191c, 191d and 191e. These branch pipes 191a, 191b, 191c, 191d and 191e are connected to an Ar gas source 192, an $O_2$ gas source 193, a $N_2$ gas source 194, a $H_2$ gas source 195, and a $C_2H_2$ gas source 196. The Ar gas source 192 supplies an Ar gas as a noble gas which is a plasma generation gas. The $O_2$ gas source 193 supplies an $O_2$ gas as an oxidizing gas which is a cleaning gas. The $N_2$ gas source 194 supplies a $N_2$ gas used as a purge gas, etc. The $H_2$ gas source 195 supplies a $H_2$ gas as a reducing gas. The $C_2H_2$ gas source 196 supplies an acetylene ($C_2H_2$) gas as a carbon-containing gas which is a film formation raw material gas. In addition, the $C_2H_2$ gas source 196 may supply other carbon-containing gases such as ethylene ($C_2H_4$).

In addition, although not illustrated, the branch pipes 191a, 191b, 191c, 191d and 191e are provided with a mass flow controller for flow rate control and valves before and after the mass flow controller. In addition, a shower plate may be provided to supply the $C_2H_2$ gas and the $H_2$ gas to a position close to the wafer W for adjusting the dissociation of gases. Further, the same effects may be obtained by downwardly extending nozzles through which these gases are supplied.

As described above, the microwave introduction device 105 is provided above the processing container 101 and functions as a plasma generator that introduces electromagnetic waves (microwaves) into the processing container 101 to generate plasma.

Figure 2:
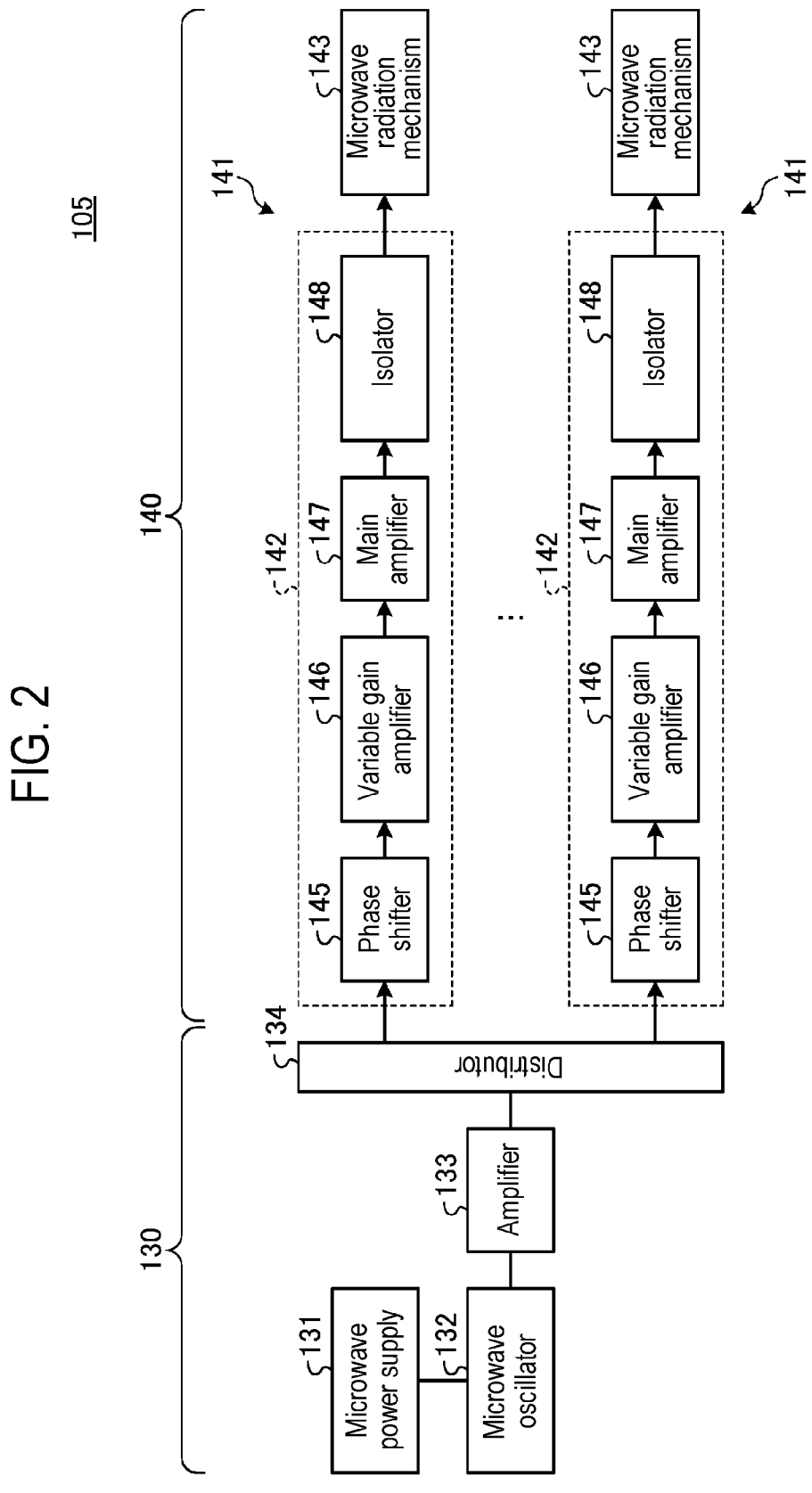
FIG. 2 is a diagram illustrating an example of a configuration of a microwave introduction device according to the first embodiment.

FIG. 2 is a diagram illustrating an example of a configuration of the microwave introduction device according to the first embodiment. As illustrated in FIGS. 1 and 2, the microwave introduction device 105 includes the ceiling wall portion 111 of the processing container 101, a microwave output section 130, and an antenna unit 140. The ceiling wall portion 111 functions as a ceiling plate. The microwave output section 130 generates microwaves and distributes and outputs the microwaves to a plurality of paths. The antenna unit 140 introduces the microwaves output from the microwave output section 130 into the processing container 101.

The microwave output section 130 includes a microwave power supply 131, a microwave oscillator 132, an amplifier 133, and a distributor 134. The microwave oscillator 132 is in a solid state and oscillates microwaves (for example, by PLL oscillation) at 860 MHz, for example. In addition, the frequency of microwaves is not limited to 860 MHz, but may be in the range of 700 MHz to 10 GHz such as 2.45 GHz, 8.35 GHz, 5.8 GHz, and 1.98 GHz. The amplifier 133 amplifies the microwaves oscillated by the microwave oscillator 132. The distributor 134 distributes the microwaves amplified by the amplifier 133 to the plurality of paths. The distributor 134 distributes the microwaves while matching impedances on an input side and an output side.

The antenna unit 140 includes a plurality of antenna modules 141. The plurality of antenna modules 141 respectively introduce the microwaves distributed by the distributor 134 into the processing container 101. All of the plurality of antenna modules 141 have the same configuration. Each antenna module 141 includes an amplifier section 142 which mainly amplifies and outputs the distributed microwaves and a microwave radiation mechanism 143 which radiates the microwaves output from the amplifier section 142 into the processing container 101.

The amplifier section 142 includes a phase shifter 145, a variable gain amplifier 146, a main amplifier 147, and an isolator 148. The phase shifter 145 changes the phase of microwaves. The variable gain amplifier 146 adjusts the power level of microwaves input to the main amplifier 147. The main amplifier 147 is configured as a solid state amplifier. The isolator 148 separates reflected microwaves, which are reflected from an antenna part of the microwave radiation mechanism 143 to be described later and are directed toward the main amplifier 147.

A plurality of microwave radiation mechanisms 143 are provided on the ceiling wall portion 111 as illustrated in FIG. 1. Further, the microwave radiation mechanism 143 includes a cylindrical outer conductor and an inner conductor provided coaxially with the outer conductor within the outer conductor. The microwave radiation mechanism 143 includes a coaxial tube having a microwave transmission path between the outer conductor and the inner conductor and the antenna part which radiates microwaves into the processing container 101. A microwave transmission plate 163 fitted into the ceiling wall portion 111 is provided on a lower surface side of the antenna part, and a lower surface thereof is exposed to an inner space of the processing container 101. The microwaves transmitted through the microwave transmission plate 163 generate plasma in the inner space of the processing container 101.

The controller 106 is typically configured with a computer and is configured to control each part of the substrate processing apparatus 100. The controller 106 includes a storage in which process sequences and process recipes, which are control parameters, of the substrate processing apparatus 100 are stored, an input device, a display, etc., and may perform predetermined control depending on a selected process recipe.

For example, the controller 106 is performed. Here, the H$_2$ gas supplied from the H$_2$ gas source 195 may be used as a hydrogen-containing gas. In addition, the hydrogen-containing gas may also include the Ar gas supplied from the Ar gas source 192. The controller 106 performs a film forming process of forming a graphene film on a substrate in plasma of a carbon-containing gas in a state where the substrate is held at a second position by lowering the substrate support pins 125, for example, while placing the substrate on the stage 102. Here, the acetylene (C$_2$H$_2$) gas supplied from the C$_2$H$_2$ gas source 196 may be used as the carbon-containing gas.

[Example of Film Formation Using Graphene Film]

Figure 3:
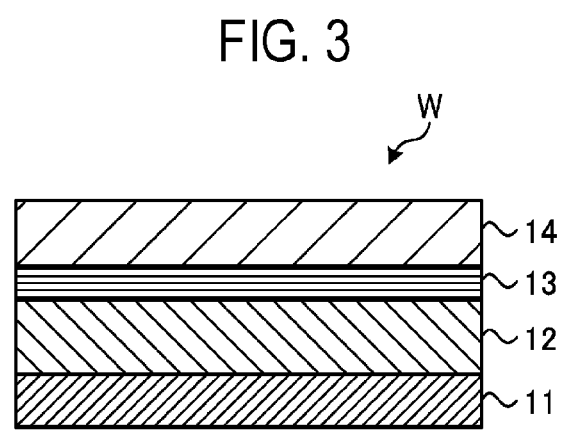

First, an application example of a graphene film will be described with reference to FIG. 3. FIG. 3 is a diagram illustrating an example of a state of a substrate after formation of a metal film according to the first embodiment. The wafer W illustrated in FIG. 3 shows a case where a polysilicon film 12, a graphene film 13, and a metal film 14 are formed on a silicon substrate 11. The graphene film 13 is a barrier film to prevent atoms of the metal film 14 from diffusing into the underlying polysilicon film 12, and has electrical conductivity between the polysilicon film 12 and the metal film 14. That is, since the graphene film 13 is a material with high barrier-ability and excellent electrical conductivity, it can be said that it is suitable as a barrier film (barrier layer).

[Reoxidation in Wet Cleaning]

Figure 4:
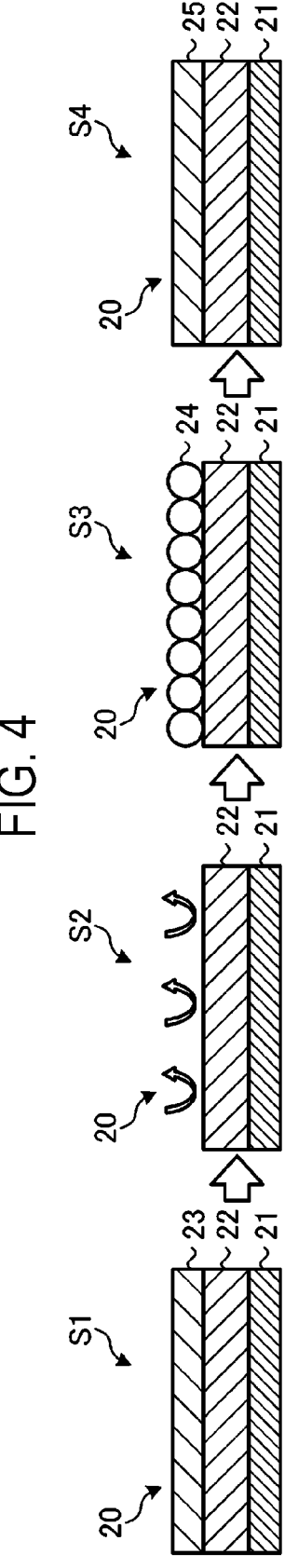
FIG. 4 is a diagram illustrating an example of a state of a substrate when wet cleaning is performed.

Next, reoxidation in wet cleaning will be described with reference to FIG. 4. FIG. 4 is a diagram illustrating an example of states of a substrate when wet cleaning is performed. As illustrated in FIG. 4, a wafer 20 in an initial state (step S1) has a natural oxide film 23 formed on a surface of a polysilicon film 22 formed on a silicon substrate 21. The natural oxide film 23 is removed by wet cleaning (step S2). Thereafter, by wafer handling (step S3) such as transfer from a wet cleaning device to a processing apparatus for forming a graphene film, molecules 24 including oxygen such as moisture or oxygen are adsorbed onto the surface of the polysilicon film 22. When the wafer 20 in this state is transferred into a chamber (processing container) of the processing apparatus for forming a graphene film, the molecules 24 cause an oxidation reaction on the surface of the polysilicon film 22 to form a re-oxidation film 25 during transfer or pre-process since the internal temperature of the chamber is set to a graphene film formation temperature (step S4). Further, the possibility of introducing oxygen into a graphene film is also considered.

[Substrate Position in Etching Process and Film Forming Process]

Next, a substrate position in the processing container 101 in each of an etching process and a film forming process will be described with reference to FIGS. 5 and 6. In addition, in the processing container 101 illustrated in FIGS. 5 and 6, a ceramics thermal spray coating 117, for example, a metal oxide such as yttria or a metal nitride, is formed as a surface coating on upper inner wall of the ceiling wall portion 111 and the sidewall portion 112.

Figure 5:
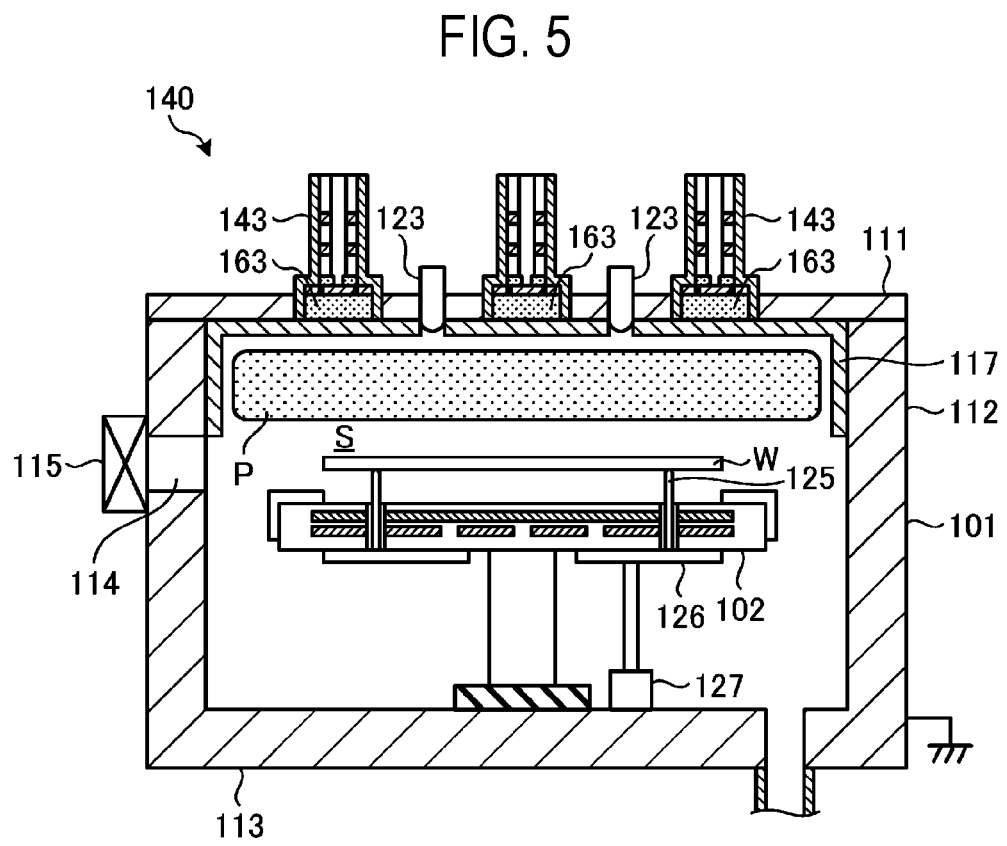
FIG. 5 is a diagram illustrating an example of a substrate position in an etching process according to the first embodiment.

FIG. 5 is a diagram illustrating an example of a substrate position in an etching process according to the first embodiment. As illustrated in FIG. 5, in the etching process, when the substrate support pins 125 receive the wafer W, they hold the received wafer W at a first position. In other words, in the etching process, the wafer W is not placed on the stage 102 but remains supported by the substrate support pins 125 above the stage 102. At this time, the first position may be 2 mm or more above from the upper surface of the stage 102, and more particularly, may be 10 mm or more above. The first position may be 12 mm from the upper surface of the stage 102, for example.

The controller 106 reduces the internal pressure of the processing container 101 to a predetermined pressure (for example, 50 mTorr to 500 mTorr) while the wafer W is held at the first position, and supplies a hydrogen-containing gas as a plasma generation gas from the gas introduction nozzle 123 into the processing container 101 to ignite plasma. In addition, the hydrogen-containing gas may also include a noble gas such as Ar gas. As illustrated in FIG. 5, in a space S of the processing container 101, plasma P is generated below the microwave transmission plate 163 which is a plasma source. In addition, the plasma P expands toward the side of the stage 102 when the internal pressure of the processing container 101 is reduced, and narrows toward the side of the ceiling wall portion 111 when the pressure is increased. Further, it is also possible to perform etching while controlling the expansion of plasma by changing the pressure in multiple stages. By changing the pressure in multiple stages to control the expansion of plasma, the amount of etching and the uniformity of etching may be improved.

The natural oxide film (re-oxidation film) on the polysilicon film 12 of the wafer W is etched by hydrogen ions or hydrogen radicals generated in the plasma P by dissociating an O component from a SiO bond and removing it as OH. However, polysilicon having an oxide film on a surface experiences a bubbling phenomenon due to bonding of hydrogen ions or hydrogen radicals with amorphous silicon in the polysilicon. Since the bubbling phenomenon occurs more frequently at higher temperatures, it is required to perform etching while keeping the temperature of the wafer W as low as possible. Therefore, as described above, the temperature rise of the wafer W may be prevented by performing etching while supporting the wafer W by the substrate support pins 125 above the stage 102 which is a heating element. Specifically, since the stage 102 is controlled by the heater 182 to a graphene film formation temperature, for example, 400 degrees C. or higher even in the etching process, but the internal pressure of the processing container 101 is reduced, the temperature of the wafer W may be kept at 350 degrees C. or lower if the wafer W is spaced apart from the stage 102 by 2 mm or more. In addition, in the etching process, the temperature of the wafer W may be more preferably kept at 300 degrees C. or lower.

Figures 6, 7:
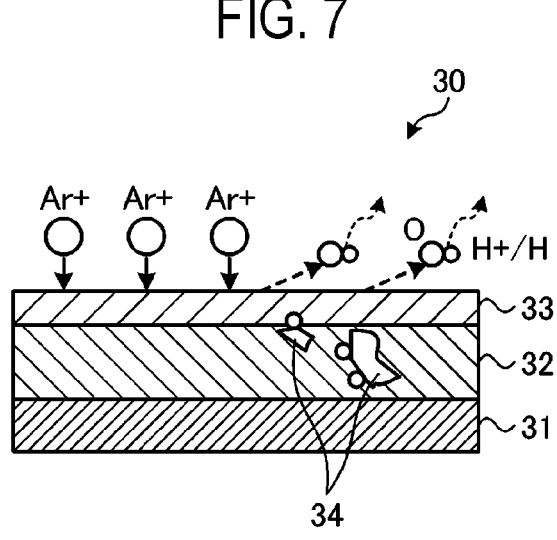
FIG. 6 is a diagram illustrating an example of a substrate position in a film forming process according to the first embodiment.
FIG. 7 is a diagram schematically illustrating a bubbling phenomenon.

FIG. 6 is a diagram illustrating an example of a substrate position in a film forming process according to the first embodiment. As illustrated in FIG. 6, in the film forming process which is performed subsequent to the etching process, the substrate support pins 125 are lowered to place the wafer W on the stage 102 which is the second position. The controller 106 controls the internal pressure of the processing container 101 to a predetermined pressure (for example, 50 mTorr to 400 mTorr) while the wafer W is placed on the stage 102, and supplies a carbon-containing gas as a plasma generation gas from the gas introduction nozzle 123 into the processing container 101 to ignite plasma. In addition, the carbon-containing gas may also include a $H_2$ gas or $N_2$ gas. Further, the carbon-containing gas may also include an inert gas including a noble gas such as Ar gas as a dilution gas. As illustrated in FIG. 6, in the space S of the processing container 101, plasma P is generated below the microwave transmission plate 163 which is a plasma source. In addition, as in the etching process, the plasma P expands toward the side of the stage 102 when the internal pressure of the processing container 101 is reduced, and narrows toward the side of the ceiling wall portion 111 when the pressure is increased.

In the film forming process, the graphene film 13 is formed on the polysilicon film 12 of the wafer W in plasma of the carbon-containing gas. The wafer W is placed on the stage 102, and is controlled by the heater 182 to the temperature of graphene film formation, for example, 400 degrees C. or higher. Although the temperature of graphene film formation, for example, the film formation temperature of about 400 degrees C. to 900 degrees C. is used, the higher the temperature, the higher the crystallinity of graphene. In the film forming process, since the oxide film is removed in the etching process, graphene can be directly formed on the surface of the polysilicon film 12. In other words, since no oxide film is sandwiched between the polysilicon film 12 and the graphene film 13, excellent contact resistance characteristics and adhesion between the polysilicon film 12 and the graphene film 13 can be obtained.

[Details of Bubbling Phenomenon]

Here, a bubbling phenomenon will be described with reference to FIGS. 7 and 8. FIG. 7 is a diagram schematically illustrating a bubbling phenomenon. In a wafer 30 illustrated in FIG. 7, a polysilicon film 32 is formed on a silicon substrate 31, and a natural oxide film 33 is formed on the polysilicon film 32. When the wafer 30 is etched using plasma of a hydrogen-containing gas including Ar, the natural oxide film 33 is etched by bonding of oxygen included in the natural oxide film 33 with hydrogen ions or hydrogen radicals generated in the plasma. Further, when the hydrogen ions or hydrogen radicals generated in the plasma bond with amorphous silicon 34 in the polysilicon film 32, a $H_2$ gas is generated to swell a surface of the polysilicon film 32 and form blisters. When the blisters are formed, a local stress is generated due to a change in the composition of the amorphous silicon 34, and the blistered locations peel off, causing a bubbling phenomenon. When the bubbling phenomenon occurs, a fatal defect is created in a device. The bubbling phenomenon may be prevented by performing temperature control since it depends on the temperature during etching.

Figure 8:
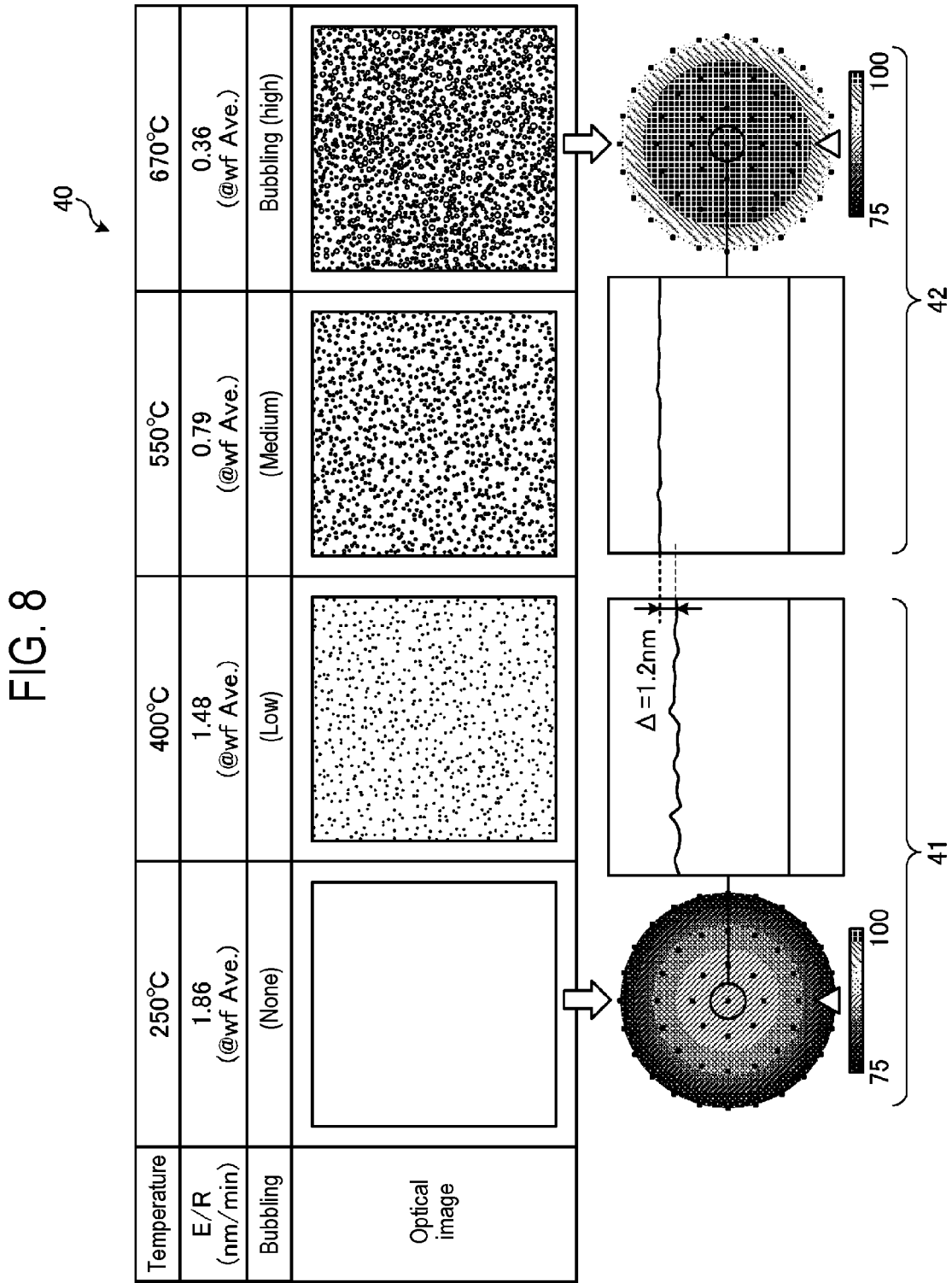
FIG. 8 is a diagram illustrating an example of the temperature dependence of the bubbling phenomenon and an etching rate.

FIG. 8 is a diagram illustrating an example of the temperature dependence of a bubbling phenomenon and an etching rate. Table 40 illustrated in FIG. 8 shows the etching rates E/R of a natural oxide film and the states of a bubbling phenomenon (bubbling reaction) when the processing time is 10 minutes and the wafer temperatures are 250 degrees C., 400 degrees C., 550 degrees C., and 670 degrees C., respectively, in Ar/$H_2$ plasma. As illustrated in FIG. 8, the bubbling phenomenon occurs more frequently at the higher wafer temperature when the wafer temperature ranges from 400 degrees C. to 670 degree C., but does not occur when the wafer temperature is 250 degrees C. In other words, since the bubbling phenomenon is caused by a Si—H reaction, lowering the wafer temperature with respect to the activation energy of that reaction may make the reaction less likely to occur, thus preventing the bubbling phenomenon.

On the other hand, the etching rates of the natural oxide film are 1.86 nm/min, 1.48 nm/min, 0.79 nm/min, and 0.36 nm/min at the wafer temperatures of 250 degrees C., 400 degrees C., 550 degrees C., and 670 degrees C., respectively, and increase at the lower wafer temperature. In other words, the throughput of etching of the natural oxide film can be enhanced at the lower etching temperature. In addition, etching rate illustrated in Table 40 is an average value of the entire wafer (wf Ave.). Analysis results 41 and 42 in FIG. 8 show the states of etching of the entire wafer by a polarization analysis method and cross sections near a surface at the wafer center when the wafer temperatures are 250 degrees C. and 670 degrees C., respectively. Comparing the analysis result 41 with the analysis result 42, it can be seen that the wafer is more etched when the wafer temperature is 250 degrees C. than when the wafer temperature is 670 degrees C. and there is a difference of 1.2 nm in the wafer center.

[Film Forming Method]

Next, a film forming method according to the first embodiment will be described. FIG. 9 is a flowchart illustrating an example of a film forming process according to the first embodiment.

In a film forming process according to the first embodiment, first, the controller 106 controls the gate valve 115 to open the loading/unloading port 114. When the loading/unloading port 114 is open, the wafer W is loaded into the space S of the processing container 101 through the loading/unloading port 114 and is received by the substrate support pins 125 protruding from the upper surface of the stage 102. That is, the controller 106 loads the wafer W into the processing container 101 (step S11). The controller 106 controls the gate valve 115 to close the loading/unloading port 114.

The controller 106 reduces the internal pressure of the processing container 101 to a predetermined pressure (for example, 50 mTorr to 500 mTorr) while holding the substrate received by the substrate support pins 125 at the first position. The controller 106 supplies a hydrogen-containing gas, which is a plasma generation gas, to the processing container 101 from the gas introduction nozzle 123. Further, the controller 106 guides the microwaves, which are distributed and output from plural places of the microwave output section 130 of the microwave introduction device 105, to the plurality of antenna modules 141 of the antenna unit 140, and radiates them from the microwave radiation mechanism 143 to ignite plasma. The controller 106 performs an etching process with plasma of the hydrogen-containing gas for a predetermined time (for example, 40 to 60 seconds) (step S12). At this time, the controller 106 controls the etching time so that the temperature of the wafer W is 350 degrees C. or lower.

Once the etching process is completed, the controller 106 lowers the substrate support pins 125 to place the wafer W on the stage 102. That is, the wafer W is held at the second position. The controller 106 controls the internal pressure of the processing container 101 to a predetermined pressure (for example, 50 mTorr to 400 mTorr) while the wafer W is placed on the stage 102. Further, the controller 106 controls the temperature of the wafer W to a predetermined temperature (for example, 400 degrees C. or higher). The controller 106 supplies a carbon-containing gas, which is a plasma generation gas, to the processing container 101 from the gas introduction nozzle 123. Further, the controller 106 controls the microwave introduction device 105 to ignite plasma. The controller 106 performs a film forming process with plasma of the carbon-containing gas for a predetermined time (for example, 5 seconds to 60 minutes) (step S13). Further, in the film forming process, a heat treatment using an Ar/H$_2$ gas or plasma pre-process using an Ar/H$_2$ gas may be performed as a film forming pre-process in order to activate a surface of the wafer W. Further, the etching process and the film forming process are performed continuously. In the film forming process, a graphene film is formed on the polysilicon film 12 at a high radical density and a low electron temperature by microwave plasma CVD, so that plasma on the wafer W is controlled to have low electron energy. This may prevent damage to the wafer W or the formed graphene film.

Once the film forming process is completed, the controller 106 controls the gate valve 115 to open the loading/unloading port 114. The controller 106 lifts the wafer W by protruding the substrate support pins 125 from the upper surface of the stage 102. When the loading/unloading port 114 is open, the wafer W is unloaded from the processing container 101 by an arm in a transfer chamber (not illustrated) through the loading/unloading port 114. In other words, the controller 106 unloads the wafer W from the interior of the processing container 101 (step S14).

Once the wafer W is unloaded, the controller 106 performs a cleaning process of cleaning the interior of the processing container 101 (step S15). In the cleaning process, a dummy wafer is placed on the stage 102 and a cleaning gas is supplied into the processing container 101 to clean a carbon film adhered to the inner wall of the processing container 101. In addition, an O$_2$ gas may be used as the cleaning gas, but an oxygen-containing gas such as CO gas or CO$_2$ gas may also be used. Further, the cleaning gas may include a noble gas such as Ar gas. Further, the dummy wafer may be omitted. Once the cleaning process is completed, the controller 106 ends the film forming process. In this way, a high-quality and low-defect graphene film may be formed since the graphene film is formed in the same processing container 101 after etching the natural oxide film of the wafer W. Further, the number of steps in the film forming process may be reduced since wet cleaning is not performed.

[Comparison of States of Substrate with Etching Process and without Etching Process]

Figure 11:
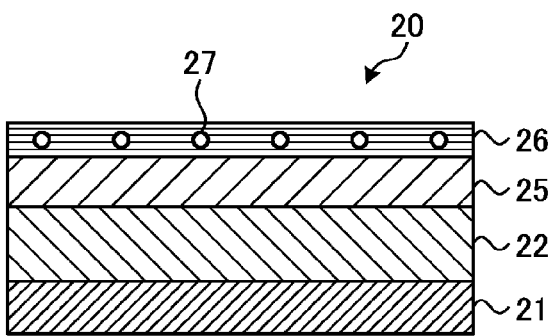
FIG. 11 is a diagram illustrating an example of a state of the substrate after formation of a graphene film according to a comparative example.

Next, a comparison of states of a wafer after graphene film formation depending on whether or not an etching process was applied before graphene film formation will be described with reference to FIGS. 10 and 11. FIG. 10 is a diagram illustrating an example of a state of a substrate after formation of a graphene film according to the first embodiment. FIG. 11 is a diagram illustrating an example of a state of a substrate after formation of a graphene film according to a comparative example.

As illustrated in FIG. 10, in the wafer W according to the first embodiment, the graphene film 13 is directly formed on the polysilicon film 12 on the silicon substrate 11 since oxidation of polysilicon can be prevented. Further, no oxygen is introduced into the graphene film 13. On the other hand, in the wafer 20 subjected to wet cleaning as a comparative example, a re-oxidation film 25 such as a silicon oxide film is formed on the surface of the polysilicon film 22 on the silicon substrate 21, and a graphene film 26 is formed on the re-oxidation film 25. Further, an oxygen component 27 may be introduced into the graphene film 26. As described above, the film forming process according to the first embodiment may realize a structure in which graphene film is successively stacked since the surface oxide film of polysilicon is removed.

Second Embodiment

In the first embodiment described above, no processing is particularly performed on the interior of the processing container 101 before loading of the wafer W, but a degassing process of removing an oxygen component remaining on the inner wall of the processing container 101, etc. may be performed in order to reduce the influence by a cleaning process. In addition, since a configuration of the substrate processing apparatus 100 according to the second embodiment is the same as that of the first embodiment, a description thereof will be omitted.

[Film Forming Method According to Second Embodiment]

Figure 12:
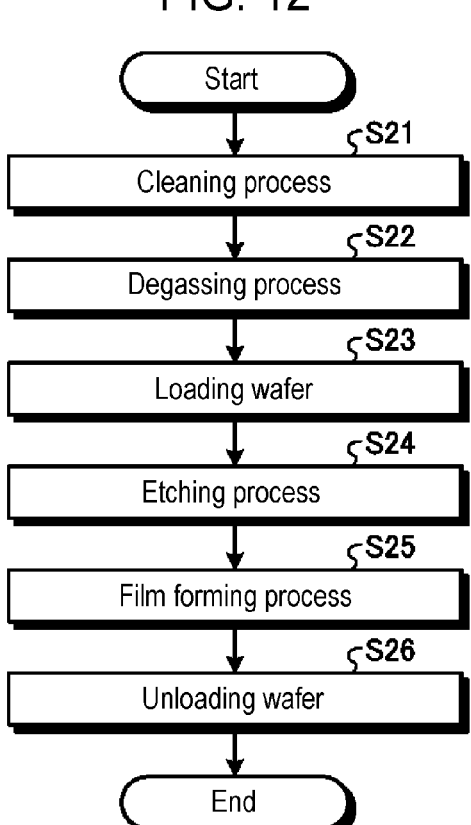
FIG. 12 is a flowchart illustrating an example of a film forming process according to a second embodiment of the present disclosure.

FIG. 12 is a flowchart illustrating an example of a film forming process according to a second embodiment of the present disclosure. In addition, the flowchart illustrated in FIG. 12 starts from a cleaning process for description purpose.

In the film forming process according to the second embodiment, first, the controller 106 performs a cleaning process of cleaning the interior of the processing container 101 (step S21). In the cleaning process, as in the first embodiment, a dummy wafer is placed on the stage 102 and a cleaning gas is supplied into the processing container 101 to clean a carbon film adhered to the inner wall of the processing container 101. In addition, an O$_2$ gas may be used as the cleaning gas, but an oxygen-containing gas such as CO gas or CO$_2$ gas may also be used. Further, the cleaning gas may include a noble gas such as Ar gas.

In other words, in the cleaning process, oxygen is introduced into the surface of the inner wall or the like of the processing container 101 or the interior of the processing container 101 under the influence of plasma of the oxygen-containing gas. Further, the surface of the inner wall or the like of the processing container 101 may be excessively oxidized, so that oxygen may remain as a reactant on the surface. When an etching process is performed while oxygen is terminated on the surface of the inner wall or the like of the processing container 101, hydrogen introduced as an etchant firstly reacts with oxygen adsorbed on the surface of the inner wall or the like of the processing container 101, which reduces a hydrogen component to be consumed for etching the wafer W. For this reason, it is preferable to remove the adsorbed oxygen in order to improve the efficiency and controllability of etching, and a degassing process of removing the adsorbed oxygen is performed subsequent to the cleaning process.

Next, the controller 106 performs a degassing process of removing the remaining oxygen (step S22). The controller 106 supplies a hydrogen-containing gas to the processing container 101 from the gas introduction nozzle 123. Further, the controller 106 controls the internal pressure of the processing container 101 to a predetermined pressure (for example, 50 mTorr to 1 Torr). For example, a $H_2$ gas or Ar/$H_2$ gas may be used as the hydrogen-containing gas in the degassing process. In addition, when the inner wall of the processing container 101 is subjected to coating, a $H_2$ gas may be used since a coating agent may be etched by Ar. In other words, when the $H_2$ gas is used, metal contamination due to the coating agent by Ar may be prevented. The controller 106 controls the microwave introduction device 105 to ignite plasma. The controller 106 performs the degassing process with plasma of the hydrogen-containing gas for a predetermined time (for example, 120 to 180 seconds). In the degassing process, an oxidation component such as $O_2$ or $H_2O$ remaining in the processing container 101 is discharged as OH radicals. In addition, no dummy wafer may be used in the cleaning process and the degassing process. Further, nitrogen may be added in the degassing process. Addition of nitrogen may improve the discharge effect using discharging in a form of NO radicals in addition to OH radicals. Further, in the degassing process, the pressure may be changed in multiple stages during implementation of the process. Changing the pressure in multiple stages enables control of the expansion of plasma. By controlling the expansion of plasma via multi-stage pressure change, oxygen remaining in the processing container 101 may be efficiently irradiated with plasma, so that the effect of removing the remaining oxygen may be improved.

Once the degassing process is completed, the controller 106 controls the gate valve 115 to open the loading/unloading port 114. When the loading/unloading port 114 is open, the wafer W is loaded into the space S of the processing container 101 through the loading/unloading port 114 and is received by the substrate support pins 125 protruding from the upper surface of the stage 102. That is, the controller 106 loads the wafer W into the processing container 101 (step S23). The controller 106 controls the gate valve 115 to close the loading/unloading port 114.

The controller 106 reduces the internal pressure of the processing container 101 to a predetermined pressure (for example, 50 mTorr to 500 mTorr) while holding the substrate received by the substrate support pins 125 at the first position. The controller 106 supplies a hydrogen-containing gas, which is a plasma generation gas, to the processing container 101 from the gas introduction nozzle 123. Further, the controller 106 controls the microwave introduction device 105 to ignite plasma. The controller 106 performs an etching process with plasma of the hydrogen-containing gas for a predetermined time (for example, 20 to 60 seconds) (step S24).

Once the etching process is completed, the controller 106 lowers the substrate support pins 125 to place the wafer W on the stage 102. That is, the wafer W is held at the second position. The controller 106 controls the internal pressure of the processing container 101 to a predetermined pressure (for example, 50 mTorr to 400 mTorr) while the wafer W is placed on the stage 102. Further, the controller 106 controls the temperature of the wafer W to a predetermined temperature (for example, 400 degrees C. or higher). The controller 106 supplies a carbon-containing gas, which is a plasma generation gas, to the processing container 101 from the gas introduction nozzle 123. Further, the controller 106 controls the microwave introduction device 105 to ignite plasma. The controller 106 performs a film forming process with plasma of the carbon-containing gas for a predetermined time (for example, 5 seconds to 60 minutes) (step S25).

Once the film forming process is completed, the controller 106 controls the gate valve 115 to open the loading/unloading port 114. The controller 106 lifts the wafer W by protruding the substrate support pins 125 from the upper surface of the stage 102. When the loading/unloading port 114 is open, the wafer W is unloaded from the processing container 101 by an arm in a transfer chamber (not illustrated) through the loading/unloading port 114. That is, the controller 106 unloads the wafer W from the interior of the processing container 101 (step S26), and ends the film forming process. In addition, when the film forming process is to be continued for another wafer W, the processes are repeated from the cleaning process of step S21. In this way, the degassing process is performed after the cleaning process, so that the efficiency and controllability of the etching process may be improved.

[Experimental Result of Degassing Process]

Figure 13:
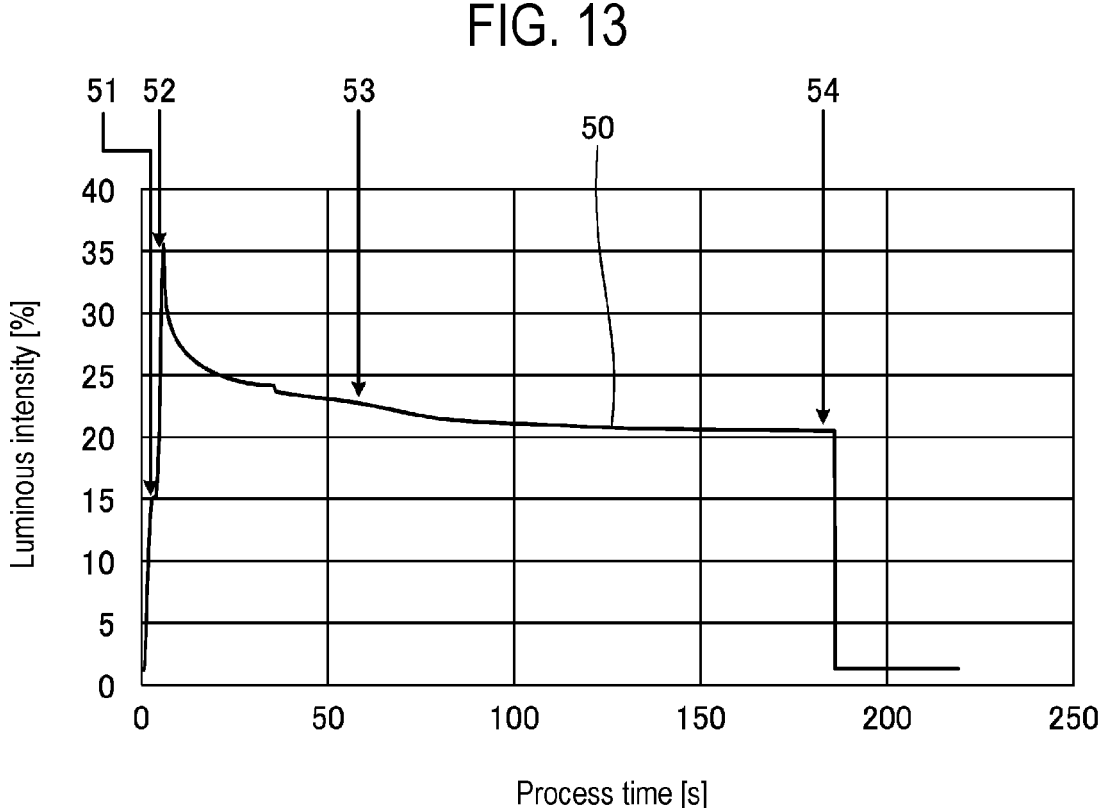
FIG. 13 is a diagram illustrating an example of a change in the luminous intensity of OH radicals according to the second embodiment.

Next, the passage of time in the removal of remaining oxygen by the degassing process will be described with reference to FIG. 13. FIG. 13 is a diagram illustrating an example of a change in the luminous intensity of OH radicals according to the second embodiment. As illustrated in FIG. 13, data for luminous intensity attenuation is acquired based on OH radicals in a plasma emission spectrum as an indicator of remaining oxygen. In Graph 50 illustrated in FIG. 13, after the start of a process, supply of a $H_2$ gas is started at timing 51 and $H_2$ plasma is ignited to start degassing at timing 52. The luminous intensity of OH radicals is about 35% immediately after timing 52, but decreases to about 23% at timing 53 after 60 seconds from the start of degassing. Furthermore, the luminous intensity decreases to about 20% at timing 54 after 180 seconds from the start of degassing. In the plasma emission spectrum, a noise floor value is about 20% in the vicinity of the wavelength of OH radicals (309 nm), so that the peak of OH radicals disappears at timing 54. From this, it can be seen that the degassing process may be performed for the processing time of 180 seconds.

Further, the degassing process is particularly effective when the inner wall of the processing container 101 is coated with ceramics. Since the ceramics coating is formed by spray irradiation, chemical oxidation process, or the like, the ceramics coating has a large number of pores and voids. These defects and gaps have a structure in which $O_2$ is likely to be pinned and $O_2$ is likely to remain. Further, the ceramics coating is a metal oxide such as yttria ($Y_2O_3$) or $Al_2O_3$, and is a material that easily attracts $O_2$ and easily forms an oxide, so that excessive oxidation thereof is likely to occur. For this reason, it is effective to withdraw $O_2$ by a plasma processing in the degassing process.

Third Embodiment

Although the substrate processing apparatus 100 having a plurality of plasma sources (microwave radiation mechanisms 143) has been used in each of the above-described embodiments, a substrate processing apparatus having a single-phase plasma source may be used. An embodiment in this case will be described as a third embodiment. In addition, a partial configuration of a substrate processing apparatus and a film forming method according to the third embodiment are the same as those in each of the above-described embodiments, and thus, descriptions of the redundant configuration and operation will be omitted.

Figure 14:
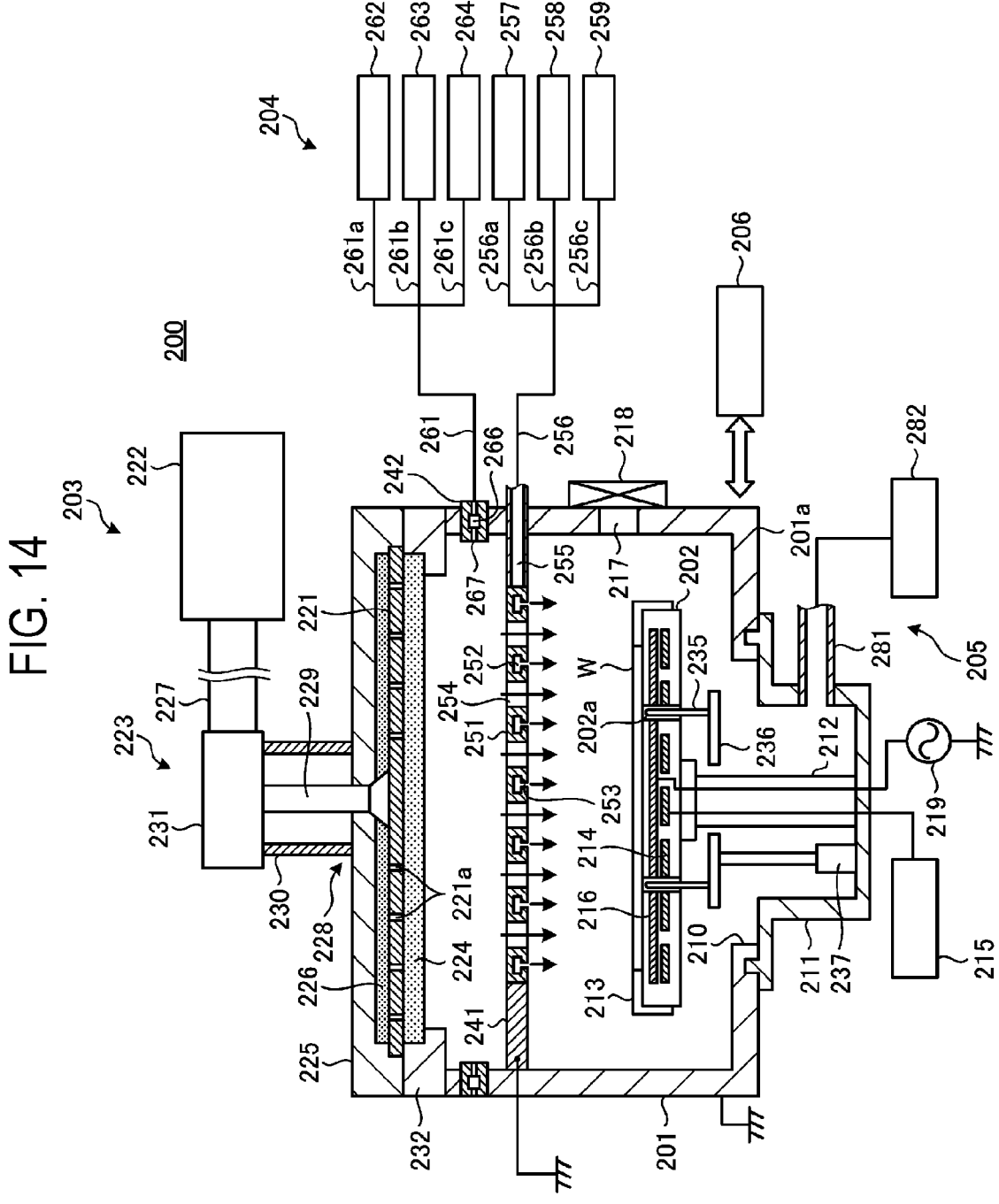
FIG. 14 is a diagram illustrating an example of a substrate processing apparatus according to a third embodiment of the present disclosure.

FIG. 14 is a diagram illustrating an example of a substrate processing apparatus according to the third embodiment of the present disclosure. The substrate processing apparatus 200 illustrated in FIG. 4 includes a processing container 201, a stage 202, a microwave introduction mechanism 203, a gas supply mechanism 204, an exhaust device 205, and a controller 206. The processing container 201 has a substantially cylindrical shape and accommodates the wafer W therein. The wafer W is placed on the stage 202. The microwave introduction mechanism 203 generates microwaves for generating plasma in the processing container 201 and introduces the microwaves into the processing container 201. The gas supply mechanism 204 supplies gases into the processing container 201. The exhaust device 205 exhausts the interior of the processing container 201. The controller 206 controls an operation of each part of the substrate processing apparatus 200.

A circular opening 210 is formed in approximately a central portion of a bottom wall 201a of the processing container 201, and an exhaust chamber 211 is provided in the bottom wall 201a to communicate with the opening 210 and protrude downward. A loading/unloading port 217 for loading and unloading the wafer W and a gate valve 218 for opening and closing the loading/unloading port 217 are provided on a sidewall of the processing container 201.

The stage 202 has a disk shape and is made of ceramics such as AlN. The stage 202 is supported by a cylindrical support member 212 made of ceramics such as AlN, which extends upward from the bottom center of the exhaust chamber 211. A guide ring 213 for guiding the wafer W is provided on the outer edge of the stage 202. Further, substrate support pins 235 for elevating the wafer W are provided inside the stage 202 so as to protrude from and retract to an upper surface of the stage 202. The substrate support pin 235 is arranged on a disk-shaped plate member 236 and is inserted into a through-hole 202a of the stage 202. The substrate support pins 235 may protrude from and retract to the upper surface of the stage 202 as the plate member 236 is vertically moved by an elevating mechanism 237. Furthermore, similarly to the stage 102 of the substrate processing apparatus 100, a heater 214 and an electrode 216 are embedded in the stage 202 and are connected to a heater power supply 215 and a radio frequency bias power supply 219, respectively.

The microwave introduction mechanism 203 is provided so as to face an upper opening of the processing container 201 and includes a planar slot antenna 221 having a plurality of slots 221a formed therein, a microwave generator 222 for generating microwaves, and a microwave transmission mechanism 223 for guiding the microwaves from the microwave generator 222 to the planar slot antenna 221. A microwave transmission plate 224 made of a dielectric is provided below the planar slot antenna 221 so as to be supported by an upper plate 232 provided in a ring shape on the top of the processing container 201. A shield member 225 having a water cooling structure is provided above the planar slot antenna 221. Furthermore, a wave-delaying member 226 is provided between the shield member 225 and the planar slot antenna 221.

The planar slot antenna 221 is made of, for example, a copper plate or aluminum plate having a surface plated with silver or gold, and has a configuration in which the plurality of slots 221a for radiating microwaves are formed therethrough in a predetermined pattern. The pattern of the slots 221a is appropriately set so as to evenly radiate microwaves. A suitable example may be a radial line slot pattern in which a plurality of pairs of slots 221a, each pair including two slots 221a arranged in a T-shape, are concentrically arranged. The length and arrangement interval of the slots 221a are appropriately determined according to the effective wavelength kg of microwaves. Further, the slot 221a may have other shapes such as a circular shape and an arc shape. Furthermore, the arrangement form of the slots 221a is not specifically limited, and the slots may be arranged, for example, in a spiral shape or a radial shape, in addition to a concentric shape. The pattern of the slots 221a is appropriately set so as to achieve microwave radiation characteristics by which a desired plasma density distribution is obtained.

The wave-delaying member 226 is made of a dielectric having a dielectric constant greater than that of vacuum, for example, a resin such as quartz, ceramics ($Al_2O_3$), polytetrafluoroethylene, and polyimide. The wave-delaying member 226 has a function of making the wavelength of microwaves shorter than that in vacuum, thus making the planar slot antenna 221 smaller. In addition, the microwave transmission plate 224 is also similarly made of a dielectric.

The thicknesses of the microwave transmission plate 224 and the wave-delaying member 226 are adjusted so that an equivalent circuit formed by the wave-delaying member 226, the planar slot antenna 221, the microwave transmission plate 224 and the plasma satisfies resonance conditions. The phase of microwaves may be adjusted by adjusting the thickness of the wave-delaying member 226. The reflection of microwaves is minimized and the radiation energy of microwaves is maximized by adjusting the thickness so that the junction of the planar slot antenna 221 becomes an "antinode" of standing waves. Further, when the wave-delaying member 226 and the microwave transmission plate 224 are made of the same material, interfacial reflection of microwaves may be prevented.

The microwave generator 222 includes a microwave oscillator. The microwave oscillator may be a magnetron or in a solid state. The frequency of microwaves oscillated from the microwave oscillator may be in the range of 300 MHz to 10 GHz. For example, microwaves with a frequency of 2.45 GHz may be oscillated by using a magnetron as the microwave oscillator.

The microwave transmission mechanism 223 includes a waveguide 227 extending horizontally for guiding the microwaves from the microwave generator 222, a coaxial waveguide 228 including an inner conductor 229 extending upward from the center of the planar slot antenna 221 and an outer conductor 230 outside thereof, and a mode conversion mechanism 231 provided between the waveguide 227 and the coaxial waveguide 228. The microwaves generated by the microwave generator 222 propagate through the waveguide 227 in a TE mode, and a vibration mode of microwaves is converted from the TE mode to a TEM mode by the mode conversion mechanism 231. The converted microwaves are guided to the wave-delaying member 226 via the coaxial waveguide 228 and are radiated from the wave-delaying member 226 into the processing container 201 through the slots 221a of the planar slot antenna 221 and the microwave transmission plate 224. In addition, a tuner (not illustrated) is provided in the middle of the waveguide 227 to match the impedance of load (plasma) in the processing container 201 with the power supply characteristic impedance of the microwave generator 222.

The gas supply mechanism 204 includes a shower plate 241 provided horizontally at a position above the stage 202 so as to vertically divide the interior of the processing container 201 and a shower ring 242 provided in a ring shape along an inner wall of the processing container 201 at a position above the shower plate 241.

The shower plate 241 includes gas flow members 251 formed in a grid shape, gas flow paths 252 provided in a grid shape within the gas flow members 251, and a large number of gas discharge holes 253 extending downward from the gas flow paths 252. Through-holes 254 are defined between the grid-shaped gas flow members 251. A gas supply path 255 extends from the gas flow paths 252 of the shower plate 241 to reach an outer wall of the processing container 201. A gas supply pipe 256 is connected to the gas supply path 255. This gas supply pipe 256 is branched into three branch pipes 256a, 256b and 256c. These branch pipes 256a, 256b and 256c are connected, respectively, to a $H_2$ gas source 257 which supplies a $H_2$ gas as a reducing gas, a $C_2H_4$ gas source 258 which supplies an ethylene ($C_2H_4$) gas as a carbon-containing gas, which is a film forming raw material gas, and a $N_2$ gas source 259 which supplies a $N_2$ gas used as a purge gas, etc. In addition, although not illustrated, the branch pipes 256a, 256b and 256c are provided with a mass flow controller for flow rate control and valves before and after the mass flow controller.

The shower ring 242 has a ring-shaped gas flow path 266 provided therein and a large number of gas discharge holes 267 connected to the gas flow path 266 to be open to the inside thereof. A gas supply pipe 261 is connected to the gas flow path 266. This gas supply pipe 261 is branched into three branch pipes 261a, 261b and 261c. These branch pipes 261a, 261b and 261c are connected, respectively, to an Ar gas source 262 which supplies an Ar gas as a noble gas, which is a plasma generation gas, an $O_2$ gas source 263 which supplies an $O_2$ gas as an oxidizing gas, which is a cleaning gas, and a $N_2$ gas source 264 which supplies a $N_2$ gas used as a purge gas, etc. In addition, although not illustrated, the branch pipes 261a, 261b and 261c are provided with a mass flow controller for flow rate control and valves before and after the mass flow controller.

The exhaust device 205 includes the exhaust chamber 211, an exhaust pipe 281 provided on a side surface of the exhaust chamber 211, and an exhaust device 282 connected to the exhaust pipe 281 and having a vacuum pump, a pressure control valve, etc.

The controller 206 is typically configured with a computer and is configured to control each part of the substrate processing apparatus 200. The controller 206 includes a storage in which process sequences and process recipes, which are control parameters, of the substrate processing apparatus 200 are stored, an input device, a display, etc., and may perform predetermined control depending on a selected process recipe.

For example, the controller 206 controls each part of the substrate processing apparatus 200 so as to perform the film forming method of each of the above-described embodiments. As a detailed example, when a substrate (wafer W) is loaded into the processing container 201, the controller 206 receives the substrate from an arm, which loads the substrate, by the substrate support pins 235 protruding from the upper surface of the stage 202. The controller 206 performs an etching process of removing an oxide film on the substrate with plasma of a hydrogen-containing gas while holding the received substrate at the first position. The controller 206 performs a film forming process of forming a graphene film on the substrate with plasma of a carbon-containing gas while holding the substrate at a second position by lowering the substrate support pins 235, for example, while placing the substrate on the stage 202. Thus, as in the film forming method of each of the above-described embodiments, the substrate processing apparatus 200 according to the third embodiment may also form a high-quality and low-defect graphene film.

As described above, according to each of the embodiments, the substrate processing apparatus 100 or 200 includes the processing container 101 or 201 capable of accommodating the substrate (wafer W) having a base film (polysilicon film 12), the stage 102 or 202 arranged in the processing container, and the controller 106 or 206. The controller performs a loading process of loading the substrate into the processing container, a first process of performing a first plasma process while holding the loaded substrate at the first position by raising the substrate support pins 125 or 235 of the stage, and a second process of performing a second plasma process while holding the substrate at the second position by lowering the substrate support pins. As a result, a high-quality and low-defect film may be formed.

Further, according to each of the embodiments, the second position is a position at which the substrate is placed on the stage, and the first position is a position at which the substrate is supported above the stage. As a result, the substrate temperature may be lowered in the first process.

Further, according to each of the embodiments, the first position is a position 2 mm or more above from the stage. As a result, the substrate temperature may be lowered in the first process.

Further, according to each of the embodiments, the first process is a process of removing an oxide formed on the base film. As a result, a high-quality and low-defect film may be formed.

Further, according to each of the embodiments, the first process uses plasma of a hydrogen-containing gas to perform the first plasma process at a first temperature and a first pressure. As a result, the oxide film formed on the base film can be etched.

Further, according to each of the embodiments, in the first process, a time period of the first plasma process is set to 60 seconds or less. As a result, the oxide film formed on the base film can be etched before the substrate temperature rises by heat input by the plasma.

Further, according to each of the embodiments, the second process is a process of forming a target film on the base film. As a result, a high-quality and low-defect film can be formed.

Further, according to each of the embodiments, the target film is a carbon film. As a result, a high-quality and low-defect carbon film can be formed.

Further, according to each of the embodiments, the carbon film is a graphene film. As a result, a high-quality and low-defect graphene film can be formed.

Further, according to each of the embodiments, the base film is a polycrystalline silicon film. As a result, a high-quality and low-defect carbon film (graphene film) can be formed on the polycrystalline silicon film.

Further, according to each of the embodiments, the second process uses plasma of a mixed gas including a raw material gas and a hydrogen gas to perform the second plasma process at a second temperature higher than the first temperature and a second pressure higher than the first pressure. As a result, a high-quality and low-defect film can be formed. In addition, the supplied hydrogen gas promotes the planar growth of graphene, and the same effect is obtained with hydrogen contained in the raw material gas. Although the supply of the hydrogen gas is not essential, but supplying the hydrogen gas accelerates the planar growth of graphene.

Further, according to each of the embodiments, the first temperature is 350 degrees C. or lower, and the second temperature is 400 degrees C. or higher. As a result, an oxide film can be etched without causing a bubbling phenomenon, and a high-quality and low-defect film can be formed.

Further, according to the second embodiment, the controller 106 performs, before the loading process, a pre-process of performing a plasma process while the substrate (wafer W as a processing target) is not present in the processing container 101. The pre-process includes a degassing process of withdrawing and removing oxygen from the processing container 101 using the plasma of the hydrogen-containing gas. As a result, the efficiency and controllability of the first process, which is the etching process, can be improved.

Each of the embodiments disclosed herein should be considered to be exemplary and not limitative in all respects. Each of the above-described embodiments may be omitted, replaced or modified in various embodiments without departing from the scope of the appended claims and their gist.

Further, in each of the above-described embodiments, a mode of forming a graphene film on the polysilicon film of the wafer W has been described, but the present disclosure is not limited to this. For example, the present disclosure may also be applied to a case where an amorphous carbon film or a diamond-like carbon film is formed on the polysilicon film of the wafer W. Furthermore, the present disclosure may also be applied to a case where a graphene film or the like is formed not only on the polysilicon film, but also on a silicon substrate or a metal film such as Cu, Ni, Co, W, or Ti. Furthermore, the present disclosure may also be applied to a case where a graphene film or the like is formed on a metal oxide film or a metal nitride film. That is, the present disclosure may be applied to a process with a temperature difference between an etching process and a film forming process.

Further, in each of the embodiments described above, the cleaning process is performed each time, but the present disclosure is not limited to this. For example, for a plurality of wafers W in one lot, the etching process and the film forming process may be performed for each wafer W, and the cleaning process may be performed when a processing for a predetermined number of wafers, for example, one lot, is completed. Further, the degassing process may be performed after the cleaning process.

Further, in each of the above-described embodiments, the substrate processing apparatus 100 or 200, which performs a processing such as etching or film formation on the wafer W using microwave plasma as a plasma source, has been described by way of example, but the technology of the disclosure is not limited to this. The plasma source is not limited to microwave plasma as long as the substrate processing apparatus performs a processing on the wafer W using plasma, and any plasma source such as capacitive coupling plasma, inductive coupling plasma, or magnetron plasma may be used.

EXPLANATION OF REFERENCE NUMERALS

11: silicon substrate, 12: polysilicon film, 13: graphene film, 100, 200: substrate processing apparatus, 101, 201: processing container, 102, 202: stage, 106, 206: controller, 125, 235: substrate support pin, W: wafer

What is claimed is:

1. A substrate processing method of processing a substrate having a base film, the method comprising:
   a loading process of loading the substrate into a processing container;
   a first process of performing a first plasma process in a state where the loaded substrate is held at a first position by raising substrate support pins of a stage arranged in the processing container; and
   a second process of performing a second plasma process while holding the substrate at a second position by lowering the substrate support pins,
   wherein the second process is a process of forming a target film on the base film.

2. The method of claim 1, wherein the second position is a position at which the substrate is placed on the stage, and
   wherein the first position is a position at which the substrate is supported above the stage.

3. The method of claim 2, wherein the first position is a position 2 mm or more above from the stage.

4. The method of claim 3, wherein the first process is a process of removing an oxide formed on the base film.

5. The method of claim 4, wherein the first process uses plasma of a hydrogen-containing gas to perform the first plasma process at a first temperature and a first pressure.

6. The method of claim 5, wherein in the first process, a time period of the first plasma process is set to 60 seconds or less.

7. The method of claim 5, wherein the second process uses plasma of a mixed gas including a raw material gas and a hydrogen gas to perform the second plasma process at a second temperature higher than the first temperature and a second pressure higher than the first pressure.

8. The method of claim 6, wherein the target film is a carbon film.

9. The method of claim 8, wherein the carbon film is a graphene film.

10. The method of claim 9, wherein the base film is a polycrystalline silicon film.

11. The method of claim 10, wherein the second process uses plasma of a mixed gas including a raw material gas and a hydrogen gas to perform the second plasma process at a second temperature higher than the first temperature and a second pressure higher than the first pressure.

12. The method of claim 11, wherein the first temperature is 350 degrees C. or lower, and
   wherein the second temperature is 400 degrees C. or higher.

13. The method of claim 12, further comprising, before the loading process, a pre-process of performing a plasma process while the substrate is not present in the processing container, wherein the pre-process includes a degassing process of withdrawing and removing oxygen from the processing container using the plasma of the hydrogen-containing gas.

14. The method of claim 1, wherein the first process is a process of removing an oxide formed on the base film.

15. The method of claim 1, wherein the first process uses plasma of a hydrogen-containing gas to perform the first plasma process at a first temperature and a first pressure.

16. The method of claim 1, further comprising, before the loading process, a pre-process of performing a plasma process while the substrate is not present in the processing container, wherein the pre-process includes a degassing process of withdrawing and removing oxygen from the processing container using the plasma of the hydrogen-containing gas.

17. The method of claim 1, wherein the base film is a polycrystalline silicon film.

18. A substrate processing apparatus comprising:

a processing container capable of accommodating a substrate having a base film;

a stage arranged in the processing container; and a controller, wherein the controller is configured to control the substrate processing apparatus so as to load the substrate into the processing container, wherein the controller is configured to control the substrate processing apparatus so as to perform a first plasma process in a state where the loaded substrate is held at a first position by raising substrate support pins of the stage, wherein the controller is configured to control the substrate processing apparatus so as to perform a second plasma process while holding the substrate at a second position by lowering the substrate support pins, and wherein the second plasma process is a process of forming a target film on the base film.

* * * * *